(12) United States Patent
Chen

(10) Patent No.: US 6,521,478 B2
(45) Date of Patent: Feb. 18, 2003

(54) METHOD FOR MANUFACTURING A LOW-PROFILE SEMICONDUCTOR DEVICE

(75) Inventor: I-Ming Chen, Taipei (TW)

(73) Assignee: Computech International Ventures Limited, Tortola (VG)

( * ) Notice: Subject to any disclaimer, the term of this patent is extended or adjusted under 35 U.S.C. 154(b) by 0 days.

(21) Appl. No.: 09/892,950

(22) Filed: Jun. 26, 2001

(65) Prior Publication Data

US 2002/0137326 A1 Sep. 26, 2002

(30) Foreign Application Priority Data

Mar. 20, 2001 (TW) ...................................... 090106523 A

(51) Int. Cl.$^7$ ............................................... H01L 21/44
(52) U.S. Cl. ...................... 438/106; 438/114; 438/127; 257/778; 257/738
(58) Field of Search ................................. 438/106, 107, 438/108, 109, 110, 111, 112, 113, 114–127; 257/778, 779, 780, 781, 737, 738, 678

(56) References Cited

U.S. PATENT DOCUMENTS

| | | | | |
|---|---|---|---|---|
| 4,816,426 A | * | 3/1989 | Bridges et al. | 437/207 |
| 5,616,520 A | * | 4/1997 | Nishiuma et al. | 438/125 |
| 6,034,437 A | * | 3/2000 | Shibata | 257/783 |
| 6,100,113 A | * | 8/2000 | Wang | 438/107 |
| 6,121,069 A | * | 9/2000 | Boyko et al. | 438/106 |
| 6,225,689 B1 | * | 5/2001 | Moden et al. | 257/686 |
| 6,331,450 B1 | * | 12/2001 | Uemura | 438/114 |
| 6,350,668 B1 | * | 2/2002 | Chakravorty | 438/612 |

FOREIGN PATENT DOCUMENTS

| | | | | |
|---|---|---|---|---|
| JP | 360189945 A | * | 9/1985 | ........... H01L/21/60 |
| JP | 04028260 A | * | 1/1992 | ......... H01L/25/065 |

* cited by examiner

Primary Examiner—Matthew Smith
Assistant Examiner—Renzo Rocchegiani
(74) Attorney, Agent, or Firm—Christensen O'Connor Johnson Kindness PLLC

(57) ABSTRACT

A method for manufacturing a semiconductor device includes the steps of preparing a semiconductor chip with a plurality of bonding pads and a plurality of conductive bumps on the bonding pads, preparing a substrate formed with a plurality of bump receiving holes and a plurality of conductive traces having contact portions adjacent to peripheries of the bump receiving holes, laying the substrate over the semiconductor chip such that the conductive bumps respectively extend through the bump receiving holes, and forming a plurality of conductive bodies, each of which encloses and electrically connects a top portion of a respective one of the conductive bumps to the contact portion of a respective one of the conductive traces.

8 Claims, 2 Drawing Sheets

METHOD FOR MANUFACTURING A LOW-PROFILE SEMICONDUCTOR DEVICE

CROSS-REFERENCE TO RELATED APPLICATION

This application claims priority of Taiwan patent Application No. 90106523, filed on Mar. 20, 2001.

BACKGROUND OF THE INVENTION

1. Field of the Invention

This invention relates to a method for manufacturing a low-profile semiconductor device.

2. Description of the Related Art

The sizes of semiconductor chips can vary widely with different chip packaging techniques. With the rapid advancement in electronic devices, minimization of profiles of semiconductor chips has been a major concern of manufacturers. Although the profiles of semiconductor chips can be made relatively low by current packaging techniques, there is still a need to further reduce the profiles of the semiconductor chips.

SUMMARY OF THE INVENTION

Therefore, the main object of the present invention is to provide a method for manufacturing a semiconductor device with a low-profile.

Another object of the present invention is to provide a low-profile semiconductor device.

According to one aspect of the present invention, there is provided a method for manufacturing a semiconductor device. The method comprises the steps of: preparing a semiconductor chip having a pad-mounting surface provided with a plurality of bonding pads thereon; preparing a substrate formed with a plurality of spaced apart bump receiving holes therein and having a trace layout surface that is formed with a plurality of conductive traces thereon which are to be respectively and electrically connected to the bonding pads and which have contact portions respectively adjacent to peripheries of the bump receiving holes; forming a plurality of conductive bumps respectively on the bonding pads of the semiconductor chip, the conductive bumps respectively having top portions; laying the substrate over the pad-mounting surface of the semiconductor chip such that the trace layout surface is distal from the pad-mounting surface and such that the top portions of the conductive bumps respectively extend through the bump receiving holes; and forming a plurality of conductive bodies, each of which encloses and electrically connects the top portion of a respective one of the conductive bumps to the contact portion of a respective one of the conductive traces.

According to another aspect of the present invention, a semiconductor device comprises: a semiconductor chip having a pad-mounting surface that is provided with a plurality of bonding pads thereon and a plurality of conductive bumps which are respectively formed on the bonding pads and which respectively have top portions; a substrate formed with a plurality of spaced apart bump receiving holes therein and having a trace layout surface that is formed with a plurality of conductive traces thereon which are to be respectively and electrically connected to the bonding pads and which have contact portions respectively adjacent to peripheries of the bump receiving holes, the substrate being laid over the pad-mounting surface of the semiconductor chip such that the trace layout surface is distal from the pad-mounting surface and such that the top portions of the conductive bumps respectively extend through the bump receiving holes; and a plurality of conductive bodies, each of which encloses and electrically connects the top portion of a respective one of the conductive bumps to the contact portion of a respective one of the conductive traces.

BRIEF DESCRIPTION OF THE DRAWINGS

In drawings which illustrate an embodiment of the invention.

DETAILED DESCRIPTION OF THE PREFERRED EMBODIMENT

FIGS. 1 to 5 illustrate consecutive steps of processing a semiconductor chip 1 and a substrate 2 for forming the preferred embodiment of a semiconductor device according to the method of this invention.

Figure 1:
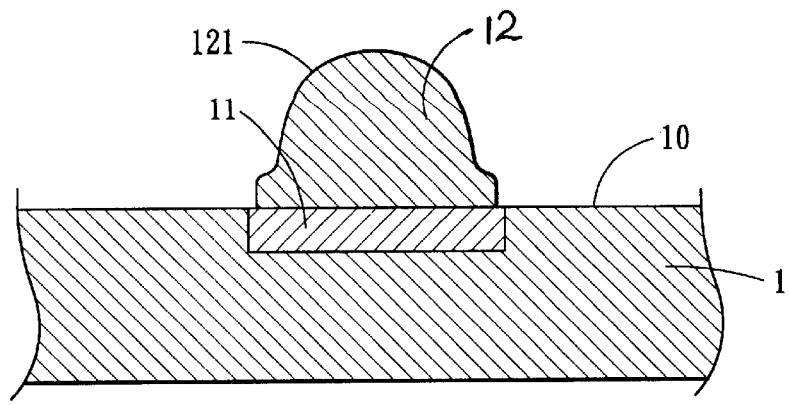
FIG. 1 illustrates the formation of a conductive bump on a bonding pad on a pad-mounting surface of a semiconductor chip according to the preferred embodiment of a method of this invention.
Figure 2:
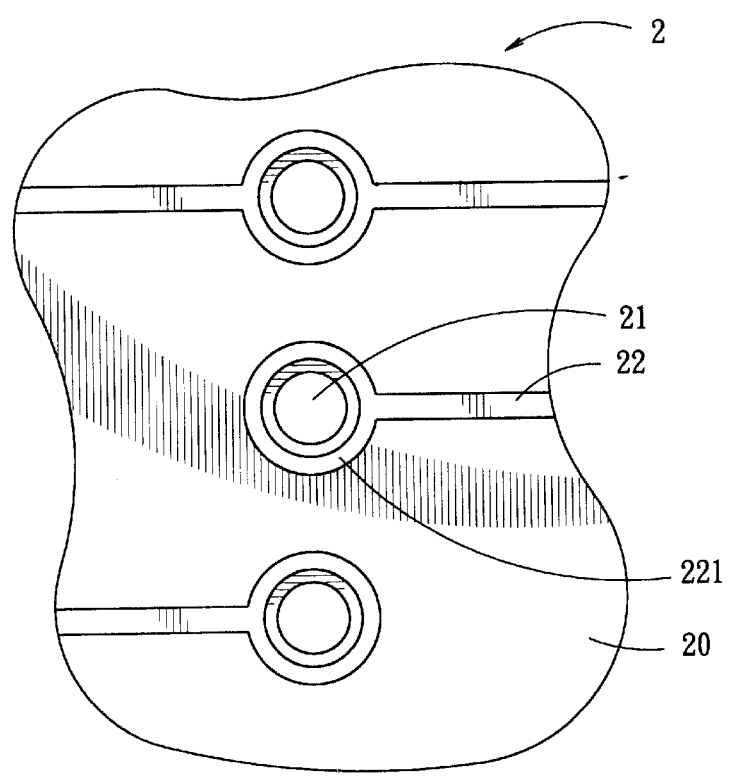
FIGS. 2 and 3 illustrates a substrate with a plurality of conductive traces on a trace layout surface thereof according to the preferred embodiment.
Figure 3:
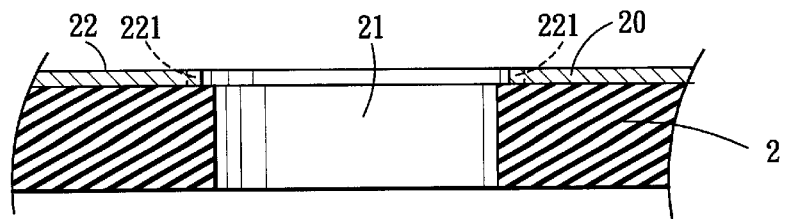
Figure 4:
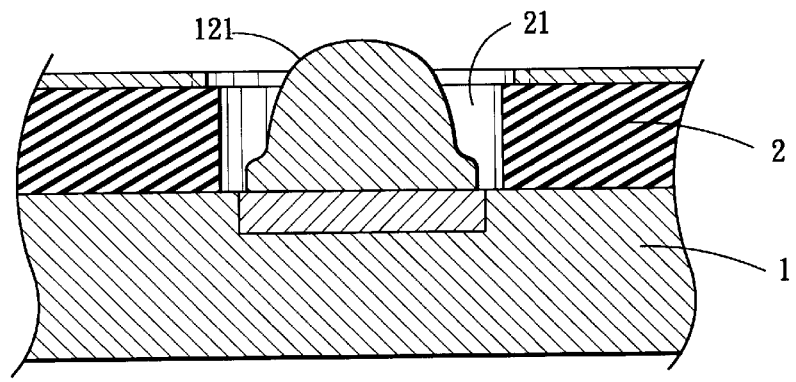
FIG. 4 illustrates the step of mounting the substrate of FIG. 2 on the semiconductor chip of FIG. 1 according to the preferred embodiment.
Figure 5:
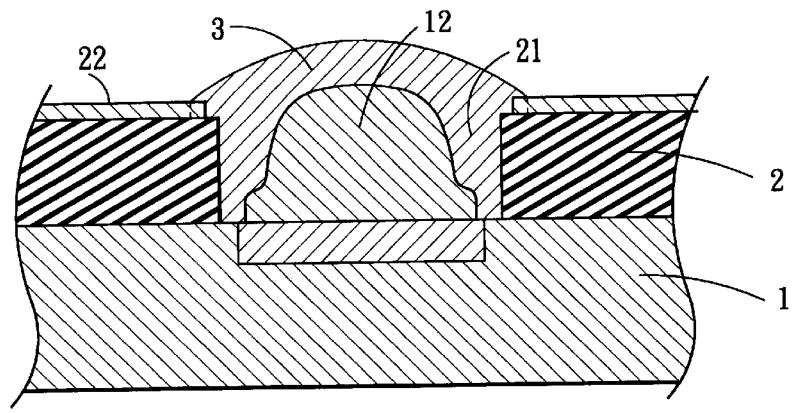
FIG. 5 illustrates the formation of a conductive body on the conductive bump of the semiconductor chip of FIG. 1 according to the preferred embodiment.

The method includes the steps of: preparing the semiconductor chip 1 having a pad-mounting surface 10 provided with a plurality of bonding pads 11 (only one bonding pad 11 is shown in FIG. 1) thereon; preparing a substrate 2 formed with a plurality of spaced apart bump receiving holes 21 therein and having a trace layout surface 20 that is formed with a plurality of conductive traces 22 thereon which are to be respectively and electrically connected to the bonding pads 11 and which have contact portions 221 respectively adjacent to peripheries of the bump receiving holes 21 (only one bump receiving hole 21 is shown in FIG. 2) ; forming a plurality of conductive bumps 12 respectively on the bonding pads 11 of the semiconductor chip 1, the conductive bumps 12 respectively having top portions 121; laying the substrate 2 over the pad-mounting surface 10 of the semiconductor chip 1 (see FIG. 4) such that the trace layout surface 20 is distal from the pad-mounting surface 10 and such that the top portions 121 of the conductive bumps 12 respectively extend through the bump receiving holes 21; and forming a plurality of conductive bodies 3, each of which encloses and electrically connects the top portion 121 of a respective one of the conductive bumps 12 to the contact portion 221 of a respective one of the conductive traces 22 (see FIG. 5).

The conductive bodies 3 are formed from a metal material or from a conductive paste that contains metal particles.

The substrate 2 can be selected from a group consisting of a tape circuit printing film, a printed circuit board, circuit boards made from glass materials, and the like, and is preferably a tape circuit printing film so that the profile of the semiconductor device can be significantly reduced. Moreover, the processing of the semiconductor device according to the method of this invention is simpler as compared to those of the prior art since there is no need to form another set of conductive bumps on the substrate to connect with the conductive bumps on the semiconductor chip.

With the invention thus explained, it is apparent that various modifications and variations can be made without departing from the spirit of the present invention. It is therefore intended that the invention be limited only as recited in the appended claims.

I claim:

1. A method for manufacturing a semiconductor device, comprising the steps of:

preparing a semiconductor chip having a pad-mounting surface provided with a plurality of bonding pads thereon;

preparing a substrate formed with a plurality of spaced apart bump receiving holes therein and having a trace layout surface that is formed with a plurality of conductive traces thereon which are to be respectively and electrically connected to the bonding pads and which have contact portions respectively adjacent to peripheries of the bump receiving holes;

forming a plurality of conductive bumps respectively on the bonding pads of the semiconductor chip, the conductive bumps respectively having top portions;

laying the substrate over the pad-mounting surface of the semiconductor chip such that the trace layout surface is distal from the pad-mounting surface and such that the top portions of the conductive bumps respectively extend through the bump receiving holes; and forming a plurality of conductive bodies, each of which encloses and electrically connects the top portion of a respective one of the conductive bumps to the contact portion of a respective one of the conductive traces.

2. The method of claim 1, wherein the substrate is a tape circuit printing film.

3. The method of claim 1, wherein the conductive bodies are formed from a metal material.

4. The method of claim 1, wherein the conductive bodies are formed from conductive paste.

5. A semiconductor device comprising:

a semiconductor chip having a pad-mounting surface that is provided with a plurality of bonding pads thereon and a plurality of conductive bumps which are respectively formed on said bonding pads and which respectively have top portions;

a substrate formed with a plurality of spaced apart bump receiving holes therein and having a trace layout surface that is formed with a plurality of conductive traces thereon which are to be respectively and electrically connected to said bonding pads and which have contact portions respectively adjacent to peripheries of said bump receiving holes, said substrate being laid over said pad-mounting surface of said semiconductor chip such that said trace layout surface is distal from said pad-mounting surface and such that said top portions of said conductive bumps respectively extend through said bump receiving holes; and a plurality of conductive bodies, each of which encloses and electrically connects said top portion of a respective one of said conductive bumps to said contact portion of a respective one of said conductive traces.

6. The semiconductor device of claim 5, wherein said substrate is a tape circuit printing film.

7. The semiconductor device of claim 5, wherein said conductive bodies are formed from a metal material.

8. The semiconductor device of claim 5, wherein said conductive bodies are formed from conductive paste.

* * * * *